United States Patent
Chepulskyy et al.

(10) Patent No.: US 9,287,322 B2
(45) Date of Patent: Mar. 15, 2016

(54) METHOD FOR CONTROLLING MAGNETIC PROPERTIES THROUGH ION DIFFUSION IN A MAGNETIC JUNCTION USABLE IN SPIN TRANSFER TORQUE MAGNETIC RANDOM ACCESS MEMORY APPLICATIONS

(71) Applicant: Samsung Electronics Co., Ltd., Gyeonggi-do (KR)

(72) Inventors: Roman Chepulskyy, Milpitas, CA (US); Dmytro Apalkov, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/704,341

(22) Filed: May 5, 2015

(65) Prior Publication Data

US 2015/0325623 A1    Nov. 12, 2015

Related U.S. Application Data

(60) Provisional application No. 61/991,961, filed on May 12, 2014.

(51) Int. Cl.
*H01L 29/82* (2006.01)
*H01L 27/22* (2006.01)
*H01L 43/02* (2006.01)
*H01L 43/08* (2006.01)
*H01L 43/12* (2006.01)

(52) U.S. Cl.
CPC ............ *H01L 27/222* (2013.01); *H01L 43/02* (2013.01); *H01L 43/08* (2013.01); *H01L 43/12* (2013.01)

(58) Field of Classification Search
CPC ........ B82Y 25/00; B82Y 40/00; H01L 43/12; H01L 43/02; H01L 43/08; H01L 27/222

USPC .............................................. 257/421; 438/3
See application file for complete search history.

(56) References Cited

U.S. PATENT DOCUMENTS

| | | | |
|---|---|---|---|
| 7,252,852 B1 | 8/2007 | Papworth | |
| 8,183,552 B2 | 5/2012 | Nakajima | |
| 8,318,510 B2 | 11/2012 | Choi | |
| 8,373,948 B2 | 2/2013 | Zeltser | |
| 2006/0262459 A1* | 11/2006 | Kamai | B82Y 40/00 360/324.11 |
| 2007/0169699 A1* | 7/2007 | Djayaprawira | B82Y 25/00 118/723 VE |
| 2011/0170339 A1 | 7/2011 | Wunderlich | |
| 2013/0034917 A1 | 2/2013 | Lee | |
| 2013/0100724 A1 | 4/2013 | Venkataraman | |
| 2014/0145792 A1* | 5/2014 | Wang | H01F 10/3272 331/94.1 |

FOREIGN PATENT DOCUMENTS

EP    2209123 A1    12/2011

* cited by examiner

*Primary Examiner* — Trung Q Dang
(74) *Attorney, Agent, or Firm* — Convergent Law Group LLP

(57) ABSTRACT

A method for providing a magnetic junction usable in a magnetic device and the magnetic junction are described. The method includes providing a reference layer, a nonmagnetic spacer layer and a free layer. The nonmagnetic spacer layer is between the free and reference layers. An interface is between the nonmagnetic spacer and free layers. Providing the free layer further includes applying at least one electric field while the free layer is at a local temperature above an operating temperature of the magnetic junction. The electric field(s) exert a force on an anion in the free layer in a direction away from the interface between the free layer and the nonmagnetic spacer layer. The magnetic junction is configured such that the free layer is switchable between stable magnetic states when a write current is passed through the magnetic junction.

23 Claims, 8 Drawing Sheets

METHOD FOR CONTROLLING MAGNETIC PROPERTIES THROUGH ION DIFFUSION IN A MAGNETIC JUNCTION USABLE IN SPIN TRANSFER TORQUE MAGNETIC RANDOM ACCESS MEMORY APPLICATIONS

CROSS-REFERENCE TO RELATED APPLICATIONS

This application claims the benefit of provisional Patent Application Ser. No. 61/991,961, filed May 12, 2014, entitled VOLTAGE CONTROL OF CRYSTALLINITY, MAGNETIC ANISOTROPY, AND TMR THROUGH ION DIFFUSION, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12 and is electrically connected to a bottom contact 14 and a top contact 22. The conventional MTJ 10, uses conventional seed layer(s) (not shown), may include capping layers (not shown) and may include a conventional antiferromagnetic (AFM) layer (not shown). The conventional magnetic junction 10 includes a conventional pinned, or reference, layer 16, a conventional tunneling barrier layer 18, and a conventional free layer 20. Conventional contacts 14 and 22 are used in driving the current in a current-perpendicular-to-plane (CPP) direction, or along the z-axis as shown in FIG. 1.

The conventional pinned layer 16 and the conventional free layer 20 are magnetic, while the conventional tunneling barrier layer 18 is nonmagnetic. The magnetization 17 of the conventional pinned layer 16 is fixed, or pinned, in a particular direction. The conventional free layer 20 has a changeable magnetization 21. Although depicted as simple layers, the free layer 20 and conventional pinned layer 16 may also include multiple layers. The pinned layer 16 and free layer 20 may have their magnetizations 17 and 21, respectively oriented perpendicular to the plane of the layers. However, the magnetizations 17 and 21 of the conventional pinned layer 16 and free layer 20 may be in plane.

To switch the magnetization 21 of the conventional free layer 20, a current is driven perpendicular to plane (in the z-direction). When a sufficient current is driven from the top contact 22 to the bottom contact 14, the magnetization 21 of the conventional free layer 20 may switch to be parallel to the magnetization 17 of the conventional pinned layer 16. When a sufficient current is driven from the bottom contact 11 to the top contact 22, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. For example, mechanisms for improving the performance of STT-RAM are desired. Accordingly, what is needed is a method and system that may improve the performance of the spin transfer torque based memories.

BRIEF SUMMARY OF THE INVENTION

A method for providing a magnetic junction usable in a magnetic device and the magnetic junction are described. The method includes providing a reference layer, a nonmagnetic spacer layer and a free layer. The nonmagnetic spacer layer is between the free and reference layers. An interface is between the nonmagnetic spacer and free layers. Providing the free layer further includes applying at least one electric field while the free layer is at a local temperature above an operating temperature of the magnetic junction. The electric field(s) exert a force on an anion in the free layer in a direction away from the interface between the free layer and the nonmagnetic spacer layer. Thus, the free layer may have a gradient in concentration of the anion such that the concentration of the anion decreases from at least the center of the free layer toward the interface. The magnetic junction is configured such that the free layer is switchable between stable magnetic states when a write current is passed through the magnetic junction.

DETAILED DESCRIPTION OF THE INVENTION

Figure 1:
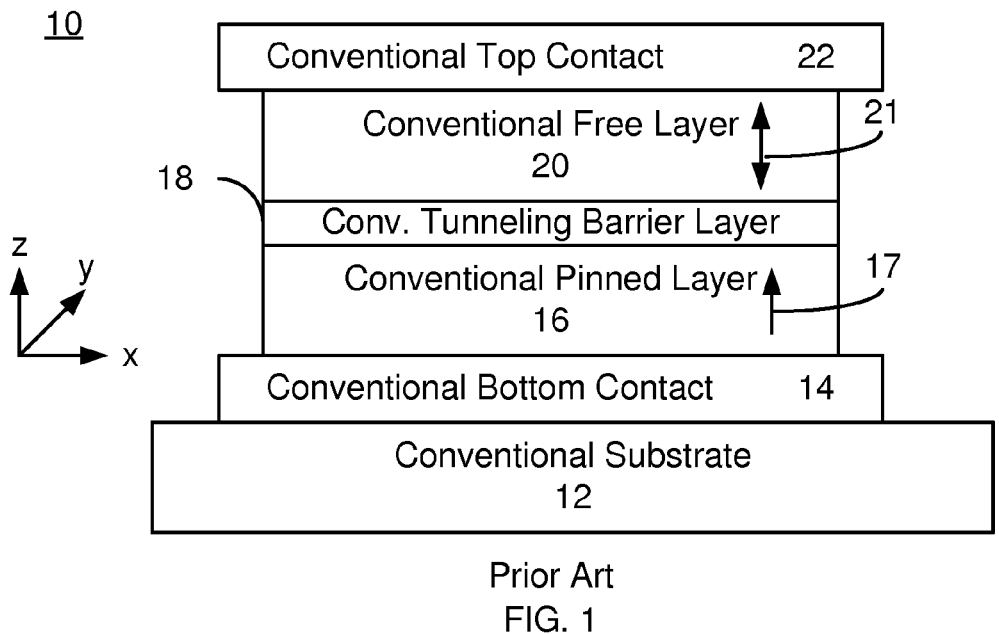
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tablets, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
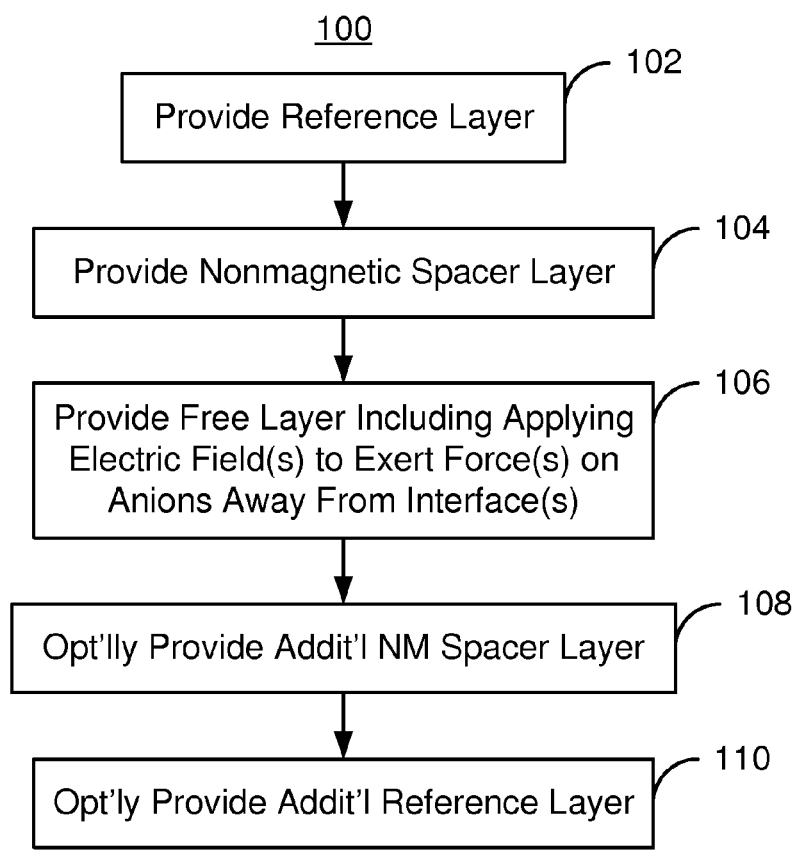
FIG. 2 depicts an exemplary embodiment of a method for providing a magnetic junction usable in a magnetic memory and programmable using spin transfer torque.

FIG. 2 depicts an exemplary embodiment of a method 100 for fabricating a magnetic junction usable in a magnetic device such as a spin transfer torque random access memory (STT-RAM) and, therefore, in a variety of electronic devices. For simplicity, some steps may be omitted, performed in another or combined. Further, the method 100 may start after other steps in forming a magnetic memory have been performed.

A reference, or pinned, layer is provided, via step 102. The reference layer is magnetic and may have its magnetization pinned, or fixed, in a particular direction during at least a portion of the operation of the magnetic junction. The reference layer may thus be thermally stable at operating temperatures. Step 102 may include depositing magnetic material(s) such as Co, Ni, and Fe as well as nonmagnetic materials. The reference layer formed in step 102 may have a perpendicular anisotropy energy that exceeds the out-of-plane demagnetization energy. Thus, the reference layer may have its magnetic moment oriented perpendicular to plane. Other orientations of the magnetization of the reference layer are possible. In some embodiments, step 102 may include applying an electric field to the reference layer in order to configure a gradient in concentration of an anion, as discussed below with respect to step 106 and the free layer.

The reference layer formed in step 102 may be a simple (single) layer or may include multiple layers. For example, the reference layer formed in step 102 may be a synthetic antiferromagnet (SAF) including magnetic layers antiferromagnetically or ferromagnetically coupled through thin nonmagnetic layer(s), such as Ru. In such a SAF, each magnetic layer may also include multiple layers. The reference layer may also be another multilayer. For example, polarization enhancement layer(s) (PEL(s)) and/or coupling layers may be desired be reside between a magnetic layer and the nonmagnetic spacer layer, discussed below. Fabrication of such layer(s) may be part of step 102. For example, an Fe or analogous layer serving as a PEL may be deposited. In some embodiments, Co/Pd multilayer(s), Co/Pt multilayer(s), CoPt alloys, Fe/Pt multilayer(s), Tb/CoFe multilayer(s), TbCo/Fe multilayer(s), TbCo/FeB multilayers, TbCoFe alloy(s), Co/Ni multilayer(s), CoFeB and/or other materials may be deposited in step 102. In such embodiments, the reference layer provided in step 102 may have a high perpendicular anisotropy that exceeds the out-of plane demagnetization energy.

The edges of the reference layer may be defined at a later time, for example after deposition of the remaining layer of the magnetic junction. In some embodiments, all of the layers of the magnetic junction may be deposited in a stack. Only after the stack has been deposited are the edges of the magnetic junction defined, for example by masking the stack and milling the exposed portions of the layers. Thus, portions of step 102 may be spaced apart in time.

A nonmagnetic spacer layer is provided, via step 104. Step 104 may include provide a tunneling barrier layers, such as a crystalline MgO layer. In some embodiments, step 104 may include depositing MgO using, for example, radio frequency (RF) sputtering. In other embodiments, metallic Mg may be deposited, then oxidized in step 104. As discussed above with respect to step 102, the edges of the nonmagnetic spacer layer may be defined at a later time, for example after deposition of the remaining layer of the magnetic junction. The nonmagnetic spacer layer provided in step 104 may be amorphous as-deposited. However, the nonmagnetic spacer layer is desired to be crystalline. For example, crystalline MgO with a (100) orientation may be desired for enhanced tunneling magnetoresistance (TMR) of the magnetic junction. Consequently, formation of the nonmagnetic spacer layer in step 104 may be considered to include annealing at some time after deposition of the layer. In alternate embodiments, the nonmagnetic spacer layer may be a conductor, a layer including conductive channels in an insulating matrix, or other structure.

A free layer is provided, via step 106. Step 106 thus includes depositing the material(s) for the free layer. The nonmagnetic spacer layer is between the free layer and the reference layer. An interface is between the nonmagnetic spacer layer and the free layer. In some embodiments, the nonmagnetic spacer layer adjoins the free layer and the interface is shared by the nonmagnetic spacer and free layers. In other embodiments, other layer(s) may be between the free and nonmagnetic spacer layers. In such embodiment, the interface may be between the nonmagnetic spacer layer and another layer.

The free layer formed in step 106 may be a simple (single) layer or may include multiple layers. For example, the free layer formed in step 106 may be a SAF and/or another multilayer. The multilayer may include magnetic and nonmagnetic layers. An insertion layer, discussed below, may also be deposited. Deposition of such layer(s) may be part of step 106. Materials deposited in step 106 may include Fe, Co, Ni and/or other material(s). For example, Fe, CoFe, CoFeB or other magnetic material(s) having the desired stoichiometries may be deposited. For example, step 106 may include providing one or more of W/CoFeB bilayer(s), Ta/CoFeB bilayer(s), CoFeB/W/CoFeB trilayer(s). These multilayers may also be repeated. The free layer provided in step 106 is also configured to be switched between stable magnetic states when a write current is passed through the magnetic junction. Thus, the free layer is switchable utilizing spin transfer torque. As discussed above, the edges of the free layer may be defined immediately after deposition of the free layer or at a later time. Thus, portions of step 106 may be spread out over time.

Providing the free layer in step 106 also includes applying electric field(s) while anions, such as oxygen anions, are mobile. When mobile, the anion(s) are relatively free to move within the free layer. This generally corresponds to applying the electric field while the free layer is at a local temperature above an operating temperature of the magnetic junction. In some embodiments, the operating temperature is on the order of one hundred and twenty degrees Celsius or less. In some embodiments, the local temperature of the free layer may be desired to be greater than one hundred degrees Celsius above the operating temperature of the magnetic junction during application of the electric field. For example, the local temperature may be desired to be greater than three hundred degrees Celsius. In some embodiments, the local temperature is desired to be in excess of four hundred degrees Celsius.

The local temperature of the free layer may be higher than the operating temperature(s) during deposition even though the ambient temperature within the deposition chamber is at or lower than operating temperature(s). The local temperature of the free layer may be high due to the deposition processes used. For example, deposition processes such as sputtering may be high energy processes. Because of the deposition process is energetic, the effective, local temperature of the free layer may be above operating temperature. Stated differently, the deposition process may result in mobile anions and allow for migration of anions. Thus, the electric field may be applied during deposition of the free layer at a high local temperature of the free layer even if no external heating is applied.

In some embodiments, the local temperature of the free layer may be high at least in part because of external heating. The substrate and/or deposition chamber may be heated during deposition. Thus, the free layer may be at an elevated temperature due to external heating instead of or in addition to the deposition process used. The electric field is applied during such heating. In such embodiments, both the ambient temperature and the local temperature of the free layer may be above the operating temperature. In such embodiments, the ambient temperature in the chamber during deposition may be on the order of three hundred fifty degrees Celsius or above.

The local temperature of the free layer may also be raised above the operating temperature by raising the ambient temperature of the environment in which the free layer resides to above the operating temperature after deposition is completed. This may be accomplished by annealing the free layer. For example, the anneal above may take place at temperature(s) of at least three hundred and fifty degrees Celsius. Thus, the local temperature may be in the ranges described above. In some embodiments, the anneal is performed after formation of the layers of the magnetic junction (deposition of layers and definition of the magnetic junction edges) is completed. Such an anneal may take place in a separate furnace. In other embodiments, the anneal may take place after deposition of the free layer, but before other layer(s) are deposited. In such embodiments, the free layer may be annealed in situ. Alternatively, the free layer/magnetic junction may be annealed at another time. During an anneal, the ambient temperature in the furnace as well as the local temperature at the free layer are above the operating temperature. The electric field is applied during some or all of the anneal. In some embodiments, the electric field may be applied after the furnace reaches the desired ambient temperature and removed only after the furnace and/or magnetic junction have cooled. Continued application of the electric field helps to ensure that the anions remain in the locations to which they have migrated during cooling. Because there may be some delay between application of the electric field and movement of the anions, there may be a minimum time for which the electric field is desired to be applied. For example, the electric field may be applied for at least five seconds. In some embodiments, the electric field is applied for greater than one hundred seconds. Thus, the anions may be frozen into the desired locations to which the anions have migrated.

The magnitude of the electric field is sufficient to move the anions in the desired direction. For example, the minimum electric field from a voltage of 0.8 V applied across the junction may be sufficient in some cases. More generally, an electric field corresponding to a voltage of at least 0.8 Volts and not more than 2 Volts may be applied to the junction during the anneal. Note that the magnitude of the electric field and the time for which the electric field is applied may not depend upon the heat source. For example, the same electric field may be used regardless of whether the local temperature is high due to deposition or due to annealing.

Thus, electric field(s) are applied while the anions, such as oxygen, are mobile due to an elevated local temperature. In some embodiments, electric field(s) may be applied during deposition and during one or more anneals. In other embodiments, the electric field(s) are applied during deposition only. In other embodiments, the electric field(s) are applied only during anneal(s).

The electric field(s) exert a force on an anion in the free layer in a direction away from the interface between the free layer and the nonmagnetic spacer layer. Thus, the electric field(s) applied have at least a component in the direction toward the interface. The anions are negatively charged and mobile within the free layer because of the elevated local temperature. Therefore, the anions tend to migrate away from the interface between the free and nonmagnetic spacer layers. Once the temperature reduced and the electric field is removed, the anions remain in or near the locations to which the anions migrated. Because the local temperature during application of the electric field is in excess of the operating temperature(s) of the magnetic junction, the anions remain substantially in place during operation of the magnetic junction. The anions are effectively frozen in place at the locations to which the anions migrated during use of the magnetic junction. Fewer of the anions/materials forming the anions may be found near the interface. For example, if oxygen is the anion, the free layer may be oxygen poor near the interface between the free layer and the nonmagnetic spacer layer. The free layer may thus be oxygen rich closer to the center or closer to the surface of the free layer opposite to the interface. Therefore, the free layer provided in step 106 have a gradient in concentration of the anion.

In some embodiments, electric field(s) in a single direction may be used in step 106. For example, if the nonmagnetic spacer layer of step 104 is provided before the free layer of step 106 and only one reference layer and one nonmagnetic spacer layer are used, the electric field(s) applied in step 106 may be directed toward the spacer layer throughout deposition/annealing. The migration of anions is in a direction away from the interface. Thus, the gradient in concentration of the anion may be such that the highest concentration of the anion may be at the surface of the free layer opposite to the interface between the free layer and the nonmagnetic spacer layer. If the anions do not migrate to the opposite surface, then the highest concentration of anions may be closer to the center of the free layer.

In other embodiments, electric field(s) having multiple directions might be used. For example, the free layer may be deposited on seed layer(s) and the nonmagnetic spacer layer provided on the free layer. In such an embodiment, step 104 may be performed after step 106. The seed layer(s) may be selected for various purposes including but not limited to the desired crystal structure of the free layer, magnetic anisotropy and/or magnetic damping of the free layer. Thus, an insulator such as MgO might be used for a seed layer. In such a case, electric fields may also be applied in a direction toward another interface between the MgO seed layer and the free layer. This may cause anions to migrate away from this interface and toward the nonmagnetic spacer layer. Other electric fields are applied, as discussed above, to cause the anions to migrate away from the interface between the nonmagnetic spacer layer and the free layer. Thus, both top and bottom surfaces of the free layer may be anion (e.g. oxygen) poor. The concentration of the anion may increase toward the center of the free layer. Similarly, for a dual magnetic junction, in which two reference layers and two nonmagnetic spacer layers are provided, the electric fields may be applied in multiple directions. One electric field may be applied to drive anions away from the lower interface, while another electric field may be applied to drive anions away from the upper interface. The electric fields applied thus tend to provide forces that are in directions away from the interfaces with the oxide layers. If these multiple electric fields are applied during deposition, then the appropriate electric field is generated during deposition of the corresponding layer. If applied during an anneal, other mechanisms may be used to achieve the desired anion gradient. For example, different annealing temperatures may be used. Thus, one electric field is applied for a higher anneal temperature while the other electric field is applied for another, lower anneal temperature. Both anneal temperatures may be above the operating temperature as discussed above. In some embodiments in which the electric field(s) are applied during anneal, different deposition techniques for the oxide layer may be used. For example, RF sputtering of Mg may be used for one layer, while natural oxidation of Mg might be used for another layer.

Application of the electric field in step 106 may be achieved by providing a voltage difference across the free layer during annealing and/or deposition. For example, contacts internal to the wafer on which the magnetic junction is being formed may be provided. In some embodiments, contacts are provided in the fabrication system or annealing furnace. A voltage difference may be developed across the contacts. This voltage difference corresponds to the electric field. As expected, the electric field is the gradient of the voltage. Thus, the electric field is a derivative of the voltage with respect to a direction through the free layer. In other embodiments, the contacts may be external to the wafer.

As discussed above, step 106 may also include providing a free layer that is a multilayer. In such an embodiment, an insertion layer may be provided within the multilayer. Such an insertion layer has an affinity for the desired anion, such as oxygen. For example, the insertion layer may include layer(s) of one or more of Sc, Y, Ca, Sr, Zr, Hf, Mg, Ti, Ba, Li, K, Na, Rb, Nb, Ag, Be, Ta, I, Al and V. In such embodiments, the insertion layer may be sandwiched between at least two ferromagnetic layers of the multilayer. Such an insertion layer may enhance the gradient in anion concentration described above. Because the insertion layer has an affinity for the anion, the concentration of the anion may be increased near the location of the insertion layer proximate to the center of the free layer. Further, in some embodiments, the perpendicular magnetic anisotropy energy of the free layer provided in step 106 exceeds the out-of-plane demagnetization energy. The magnetic moment of the free layer may thus be out-of-plane, including perpendicular-to-plane. In such embodiments, the free layer may include multilayers such as high interfacial anisotropy materials interleaved with coupling layers. In addition, a PEL(s) may be provided as part of or in addition to the free layer.

If a dual magnetic junction is to be fabricated, then steps 108 and 110 are performed. An additional nonmagnetic spacer layer may optionally be provided, via step 108. The free layer is between the nonmagnetic spacer layer provided in step 104 and the additional nonmagnetic spacer layer provided in step 108. Step 108 is analogous to step 104. However, different materials and/or different thicknesses might be used. Step 108 may include depositing MgO, which forms a tunneling barrier layer. In some embodiments, the MgO may be deposited via RF sputtering. In other embodiments, metallic Mg may be deposited, then oxidized. As discussed above, the edges of the nonmagnetic spacer layer may be defined at a later time, for example after deposition of the remaining layer of the magnetic junction. Further, an anneal may also be performed to achieve the desired crystallinity of the additional nonmagnetic spacer layer. In alternate embodiments, the nonmagnetic spacer layer may be a conductor, a layer including conductive channels in an insulating matrix, or other structure.

An additional reference layer may optionally be provided, via step 110. The additional reference layer is magnetic and may have its magnetization pinned, or fixed, in a particular direction during at least a portion of the operation of the magnetic junction. The reference layer may thus be thermally stable at operating temperatures. Step 110 may be analogous to step 102. Thus, analogous reference layer(s) may be fabricated. The directions of magnetization of the reference layer formed in step 110 and the direction of magnetization of reference layer formed in step 102 may be antiparallel (dual state) or parallel (antidual state). The reference layer formed in step 110 may be a simple (single) layer or may include multiple layers. The additional reference layer formed in step 110 may have a perpendicular anisotropy energy that exceeds the out-of-plane demagnetization energy. Thus, the reference layer may have its magnetic moment oriented perpendicular to plane. Other orientations of the magnetization of the reference layer are possible.

Step 110 may include depositing magnetic material(s) such as Co, Ni, and Fe as well as nonmagnetic materials. As discussed above, the reference layer provided in step 110 may be configured to have a high perpendicular anisotropy that exceeds the out-of plane. In such embodiments, Co/Pd multilayer(s), Co/Pt multilayer(s), CoPt alloys, Fe/Pt multilayer(s), Tb/CoFe multilayer(s), TbCo/Fe multilayer(s), TbCo/FeB multilayers, TbCoFe alloy(s), Co/Ni multi-p layer(s), CoFeB and/or other materials may be provided in step 110.

Although application of the electric field at local temperature(s) above the operating temperature of the magnetic junction is described in terms of the free layer, this portion of step 106 may be extended to the reference layer(s) in step 102 and/or step 110. Thus, during deposition and/or annealing, an electric field may be applied to the reference layer(s) of the magnetic junction. In such embodiments, the reference layer(s) may also have a gradient in anion concentration such that the concentration of the anion increases with increasing distance from the free layer through at least part of the reference layer(s). For example, the reference layer(s) may include a PEL, such as an Fe layer, that adjoins a nonmagnetic spacer layer. An electric field may be applied while anions in the PEL are mobile, for example because the local temperature of the PEL is above the operating temperature of the magnetic junction. This may occur during deposition and/or annealing. The electric field is or has a component in a direction toward the PEL-nonmagnetic spacer layer interface. As a result, anions such as oxygen migrate away from the PEL-nonmagnetic spacer layer interface. Thus, the reference layer or PEL may be anion (oxygen) poor near the interface with the nonmagnetic spacer layer.

In the above method, the electric field is described as being applied to the free layer and/or reference layer(s). However, in some cases, the electric field may be applied to larger portions of the magnetic junction, including but not limited to the entire junction. For example, the electric field may be applied during an anneal of the already fabricated magnetic junction. The electric field across the free and/or reference layer may be generated by developing a voltage across contacts outside of the magnetic junction. In such a case, the electric field may be applied across the entire magnetic junction.

Using the method 100, performance of a magnetic junction may be improved. More specifically, crystallinity, magnetic anisotropy and/or tunneling magnetoresistance of the magnetic junction may be enhanced. Application of the electric field(s) during deposition and/or annealing may cause oxygen anions to migrate away from the interface(s) with oxide layers such as MgO. For example, oxygen may migrate away from the interfaces between the free layer and nonmagnetic spacer layer(s) and/or interfaces between the free layer and oxide seed or capping layers. Similarly, oxygen may migrate away from interfaces between the reference layer(s) and nonmagnetic spacer layer(s). As a result, the crystallization of the free layer and/or the reference layer may be improved. For example, the desired crystal structure and/or orientation might be achieved. Further, the interface between a crystalline MgO nonmagnetic spacer layer and the free layer or reference layer may be improved. This improvement may result in an increased perpendicular magnetic anisotropy (PMA). Thus, the stability other characteristics related to the magnetic anisotropy may be improved. This improved interfaces may also result in increased tunneling magnetoresistance (TMR). Thus, the signal to noise ratio of the magnetic junction may be enhanced. Performance of the magnetic junction and any electronic devices utilizing the magnetic junction may be improved.

Figure 3:
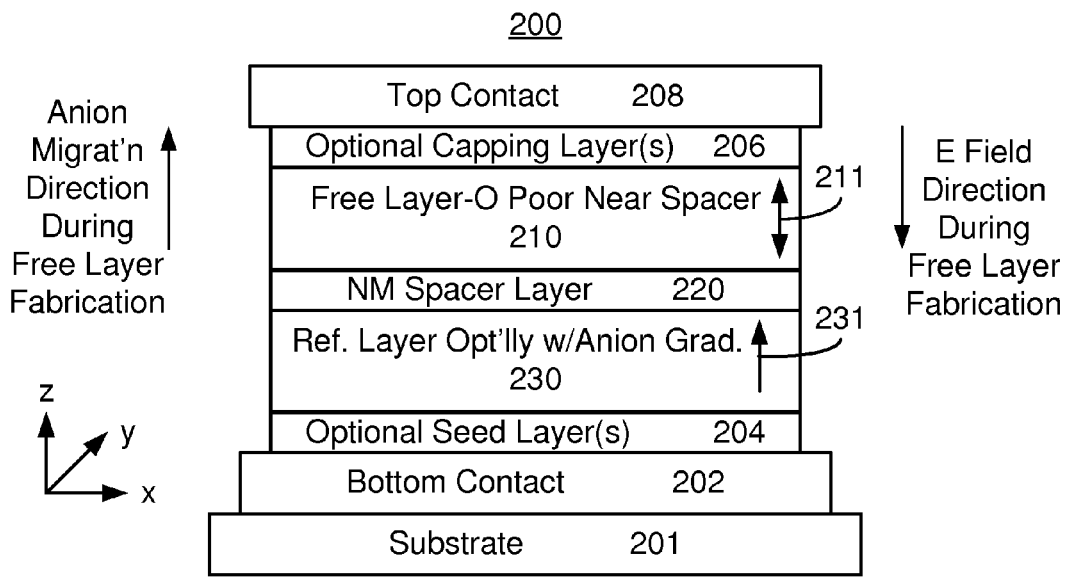
FIG. 3 depicts an exemplary embodiment of a magnetic junction usable in a magnetic memory programmable using spin transfer torque.

FIG. 3 depicts an exemplary embodiment of a magnetic junction 200 that may be fabricated using the method 100, as well as some surrounding structures. For clarity, FIG. 3 is not to scale. The magnetic junction 200 may be used in a magnetic device such as a STT-RAM and, therefore, in a variety of electronic devices. The magnetic junction 200 includes a free layer 210 having a changeable magnetic moment 211, a nonmagnetic spacer layer 220, and a reference layer 230 having magnetic moment 231. Also shown is an underlying substrate 201 in which devices including but not limited to a transistor may be formed. Bottom contact 202, top contact 208, optional seed layer(s) 204 and optional capping layer(s) 206 are also shown. In FIG. 3, the reference layer 230 is closer to the substrate 201 than the free layer 210. However, the order of the layers 210, 220 and 230 may be reversed in another embodiments. An optional pinning layer (not shown) may be used to fix the magnetization (not shown) of the reference layer 230. The optional pinning layer may be an AFM layer or multilayer that pins the magnetization (not shown) of the reference layer 230 by an exchange-bias interaction. However, in other embodiments, the optional pinning layer may be omitted or another structure may be used.

The perpendicular magnetic anisotropy energies of the reference layer 230 and of the free layer 210 each exceeds the out of plane demagnetization energies of the reference layer 230 and free layer 210. Consequently, the magnetic moments 211 and 231 of the free layer 210 and the reference layer 230, respectively, may be perpendicular to plane. The magnetic junction 200 is also configured to allow the free layer 210 to be switched between stable magnetic states when a write current is passed through the magnetic junction 200. Thus, the free layer 210 is switchable utilizing spin transfer torque.

The nonmagnetic spacer layer 220 may be an insulating tunneling barrier layer, such as MgO. In some embodiments, the capping layer(s) may include an MgO layer adjoining the free layer 210. In some embodiments, the optional seed layer(s) 204 include an MgO seed layer adjoining the reference layer 230.

FIG. 3 also depicts a component of the electric field during fabrication of the free layer in step 106 as being along the z-axis. For example, the electric field may be applied during deposition and/or anneal. In some embodiments, the electric field is entirely along the z-axis. In other embodiments, the electric field may have a component in the x-y plane. Because of the electric field shown in FIG. 3, the direction of anion migration includes a component along the z-axis and away from the interfaces between the layers 210 and 220. In some embodiments, the anions migrate substantially along the z-axis. Thus, the free layer 210 may be oxygen poor near the spacer layer 220. Stated differently, the concentration of oxygen various in the z-direction such that the concentration of oxygen increases away from the spacer layer 220. This gradient in the concentration of oxygen may result in improved performance. The magnetic junction 200 may have improved crystallinity of the free layer 210, an improved interface between the nonmagnetic spacer layer 220 and the free layer 210, increased TMR and enhanced PMA of the free layer 210. The magnetic junction 200 and free layer 210 may exhibit improved performance. This performance may be further enhanced by the inclusion of an insertion layer within the free layer that has affinity for the anion.

If MgO or other oxide capping layer(s) are used, step 106 may include applying an additional field in substantially the opposite direction to that shown in FIG. 3. Thus, the free layer 210 may also be oxygen poor near the interface with the capping layer(s) 206. The gradient in oxygen concentration may be such that the oxygen concentration along the z-axis increases from the bottom surface toward the center of the free layer 210 then decreases toward the upper surface. The free layer 210 may be oxygen poor near its top and bottom surfaces. Performance of the magnetic junction 200 may be further improved.

Although not indicated in FIG. 3, the reference layer 230 may also be configured to have a gradient in the oxygen/anion concentration using electric field(s). The reference layer 230 may thus have a gradient in oxygen concentration such that the oxygen concentration in the reference layer 230 increases along the z-axis in a direction away from the nonmagnetic spacer layer 220. As discussed above for the free layer, if optional seed layer(s) 204 include MgO or analogous layer(s), then multiple electric fields may be used in step 102 to provide a reference layer having a gradient in oxygen concentration such that the oxygen concentration decreases toward the top and bottom surfaces of the reference layer 210. As a result, performance of the magnetic junction 200 may be further enhanced.

Figure 4:
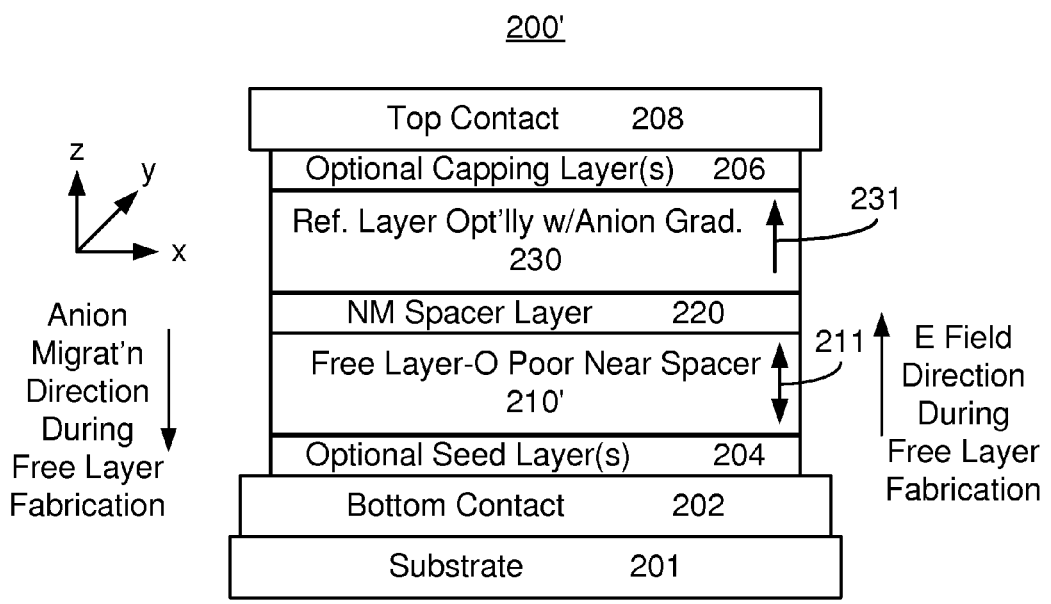
FIG. 4 depicts another exemplary embodiment of a method for providing a magnetic junction usable in a magnetic memory and programmable using spin transfer torque.

FIG. 4 depicts another exemplary embodiment of a magnetic junction 200' that may be fabricated using the method 100, as well as some surrounding structures. For clarity, FIG. 4 is not to scale. The magnetic junction 200' may be used in a magnetic device such as a STT-RAM and, therefore, in a variety of electronic devices. The magnetic junction 200' includes a free layer 210' having a changeable magnetic moment 211, a nonmagnetic spacer layer 220, and a reference layer 230 having magnetic moment 231 that are analogous to the free layer 210, magnetic moment 211, nonmagnetic spacer layer 220, reference layer 230 and magnetic moment 231, respectively in magnetic junction 200. Also shown are substrate 201, contacts 202 and 208, seed layer(s) 204 and capping layer(s) 206 that are analogous to the substrate 201, contacts 202 and 208, seed layers 204 and capping layers 206, respectively in the magnetic junction 200. Analogous components have similar structure, function and fabrication methods to those described above. For example, the perpendicular magnetic anisotropy energies of the reference layer 230 and of the free layer 210' each still exceeds the out of plane demagnetization energies of the reference layer 230 and free layer 210'. The magnetic junction 200' is also configured to allow the free layer 210' to be switched between stable magnetic states when a write current is passed through the magnetic junction 200'. Thus, the free layer 210' is switchable utilizing spin transfer torque.

In FIG. 4, the free layer 210' is closer to the substrate 201 than the reference layer 230. Thus, the order of the layers 210', 220 and 230 has been reversed from that shown in FIG. 3. Thus, the direction of the electric field applied during free layer fabrication so that anions migrate away from the interface between the nonmagnetic spacer layer 220 and the free layer 210' has been changed. The electric field has at least a component in the positive z-direction such that anions migrate in the negative z-direction. The free layer 210' is, therefore, still oxygen poor close to the nonmagnetic spacer layer 220. As discussed above for the magnetic junction 200, additional electric field(s) may be applied. Thus, the free layer 210' may also be oxygen poor near optional seed layer(s) 204, particularly if the optional seed layer(s) 204 include an MgO seed layer. Similarly, the reference layer 230 may be oxygen poor near the bottom and/or top surfaces closer to the nonmagnetic spacer layer 220 and/or optional capping layer(s) 206.

The magnetic junction 200' may exhibit improved performance. As discussed above with respect to an MgO nonmagnetic spacer layer, there may be improved crystallinity of the free layer 210', an improved interface between the nonmagnetic spacer layer 220 and the free layer 210', increased TMR and enhanced PMA of the free layer 210'. These effects may be further enhanced by the inclusion of an insertion layer within the free layer 210' that has affinity for the anion. Controlling the oxygen gradient in the free layer 210' near the seed layer(s) 204 and/or the oxygen gradient in the reference layer 230' may further improve characteristics such as TMR and PMA. The magnetic junction 200' may thus have improved performance.

Figure 5:
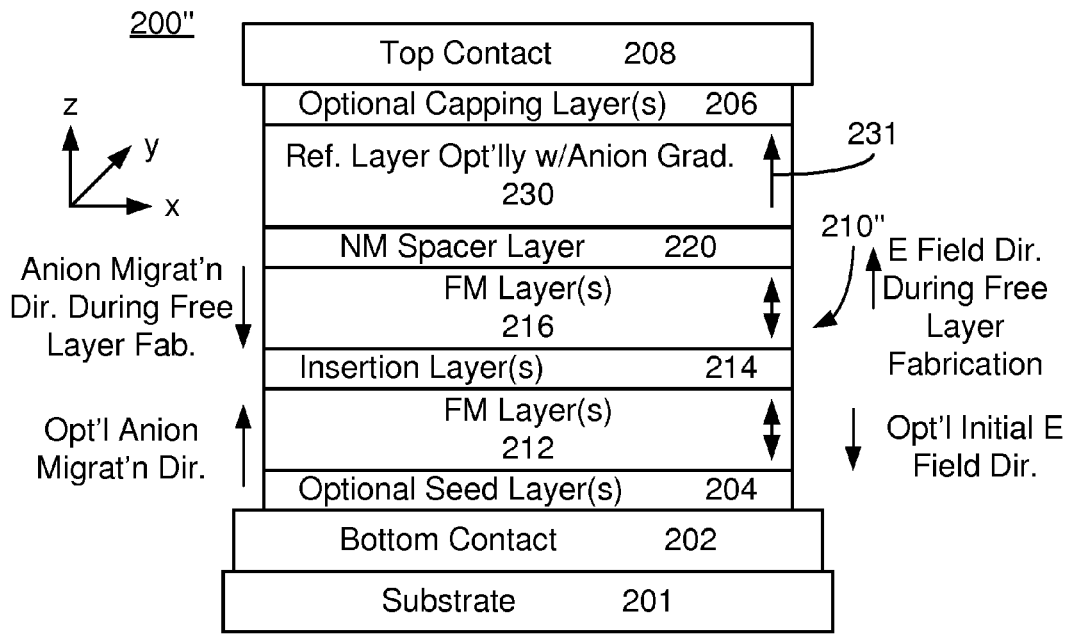
FIG. 5 depicts another exemplary embodiment of a method for providing a magnetic junction usable in a magnetic memory and programmable using spin transfer torque.

FIG. 5 depicts another exemplary embodiment of a magnetic junction 200" that may be fabricated using the method 100, as well as some surrounding structures. For clarity, FIG. 5 is not to scale. The magnetic junction 200" may be used in a magnetic device such as a STT-RAM and, therefore, in a variety of electronic devices. The magnetic junction 200" includes a free layer 210" having a changeable magnetic moment, a nonmagnetic spacer layer 220, and a reference layer 230 having magnetic moment 231 that are analogous to the free layer 210/210', nonmagnetic spacer layer 220, reference layer 230 and magnetic moment 231, respectively in the magnetic junctions 200 and/or 200'. Also shown are substrate 201, contacts 202 and 208, seed layer(s) 204 and capping layer(s) 206 that are analogous to the substrate 201, contacts 202 and 208, seed layers 204 and capping layers 206, respectively in magnetic junction(s) 200 and/or 200'. Analogous components have similar structure, function and fabrication methods to those described above. For example, the perpendicular magnetic anisotropy energies of the reference layer 230 and of the free layer 210" each still exceeds the out of plane demagnetization energies of the reference layer 230 and free layer 210". The magnetic junction 200" is also configured to allow the free layer 210" to be switched between stable magnetic states when a write current is passed through the magnetic junction 200". Thus, the free layer 210" is switchable utilizing spin transfer torque. In addition, although the free layer 210" is depicted as being closer to the substrate than the reference layer 230, in other embodiments, the order of the layers 210", 220 and 230 with respect to the substrate 201 may be reversed.

In FIG. 5, the free layer 210" includes at least two ferromagnetic layers 212 and 216 separated by an insertion layer 214. In some embodiments, each ferromagnetic layer 212 and 216 is a single layer. In other embodiments, one or both of the ferromagnetic layers 212 and 216 may be a multilayer. The multilayer(s) include magnetic layers and, in some embodiments, nonmagnetic layers. The perpendicular magnetic anisotropy energies of the layers 212 and 216 each exceeds the out of plane demagnetization energies of the layers 212 and 216, respectively. The insertion layer 214 may have a high oxygen affinity. For example, the insertion layer 214 may be a layer of one or more of Sc, Y, Ca, Sr, Zr, Hf, Mg, Ti, Ba, Li, K, Na, Rb, Nb, Ag, Be, Ta, I, Al and V. In some embodiments, the insertion layer 214 has a thickness of at least one Angstrom and not more than ten Angstroms.

In the embodiment shown in FIG. 5, multiple electric fields are used in step 106, for fabrication of the free layer 210". An optional initial electric field may be applied for the ferromagnetic layer(s) 212. The initial electric field has at least a component in a direction toward the seed layer(s) 204, along the z-axis. Such an electric field may be used if the optional seed layer(s) 204 include an oxide seed layer such as an MgO seed layer. Thus, anions in the ferromagnetic layer(s) migrate away from the seed layer(s) 204. An additional electric field is applied for the ferromagnetic layer(s) 216. The direction of the electric field applied during free layer fabrication causes anions to migrate away from the interface between the nonmagnetic spacer layer 220 and the ferromagnetic layer(s) 216. This electric field has at least a component in the positive z-direction such that anions migrate in the negative z-direction. The free layer 210" is, therefore, oxygen poor close to the nonmagnetic spacer layer 220 and, in some embodiments, close to the seed layer(s) 204. As discussed above for the magnetic junction 200, additional electric field(s) may be applied. Thus, the reference layer 230 may be oxygen poor near the bottom and/or top surfaces closer to the nonmagnetic spacer layer 220 and/or optional capping layer(s) 206.

If the electric fields are applied during deposition of the free layer, then the electric field for the layers 212 is applied first, then the field applied for the layer 216. In embodiments in which the electric fields are applied during an anneal, the electric field for the layer 212 may be omitted. Alternatively, different annealing temperatures may be used. Thus, one electric field is applied for a higher anneal temperature while the other electric field is applied for another, lower anneal temperature. Both anneal temperatures may be above the operating temperature as discussed above. In some embodiments in which the electric field(s) are applied during anneal, different deposition techniques for the oxide layer may be used.

The magnetic junction 200" may exhibit improved performance. As discussed, the free layer 210" may have improved crystallinity, an improved interface with the nonmagnetic spacer layer 220, increased TMR and enhanced PMA. These effects may be further enhanced by the inclusion of the insertion layer 214 that has a high oxygen affinity. Controlling the oxygen gradient in the reference layer 230' may further improve characteristics such as TMR and PMA. The magnetic junction 200'" may thus have improved performance.

Figure 6:
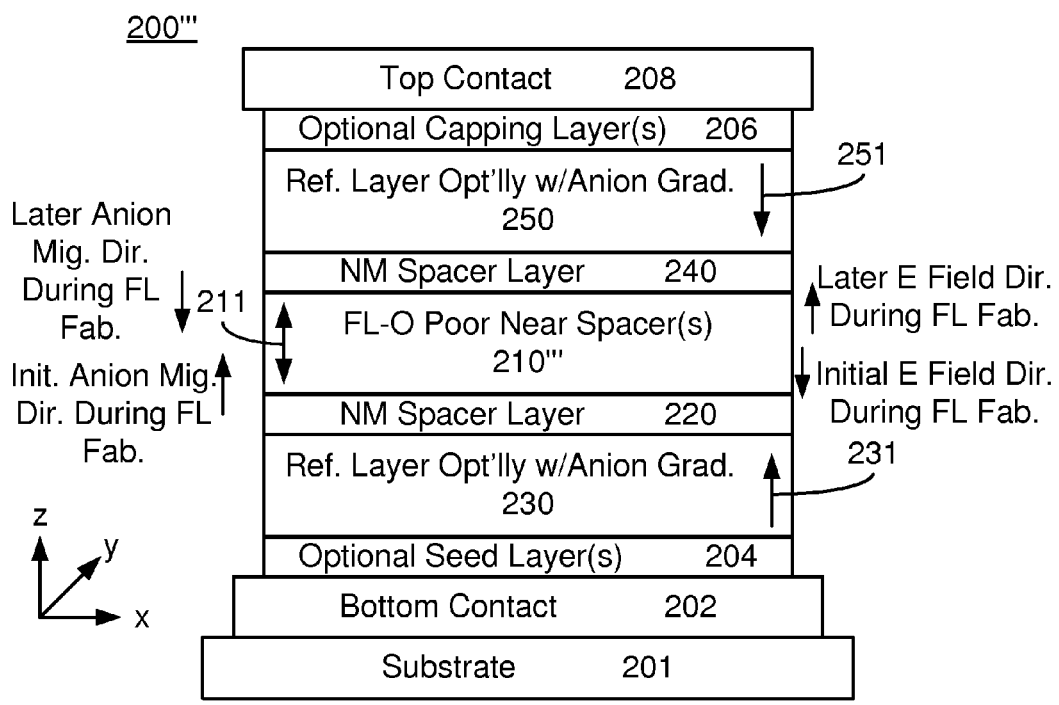
FIG. 6 depicts another exemplary embodiment of a magnetic junction usable in a magnetic memory programmable using spin transfer torque.

FIG. 6 depicts another exemplary embodiment of a magnetic junction 200'" that may be fabricated using the method 100, as well as some surrounding structures. For clarity, FIG. 6 is not to scale. The magnetic junction 200" may be used in a magnetic device such as a STT-RAM and, therefore, in a variety of electronic devices. The magnetic junction 200'" includes a free layer 210'" having a changeable magnetic moment 211, a nonmagnetic spacer layer 220, and a reference layer 230 having magnetic moment 231 that are analogous to the free layer 210/210'/210", magnetic moment 211, nonmagnetic spacer layer 220, reference layer 230 and magnetic moment 231, respectively. Also shown are substrate 201, contacts 202 and 208, seed layer(s) 204 and capping layer(s) 206 that are analogous to the substrate 201, contacts 202 and 208, seed layers 204 and capping layers 206, respectively in junction(s) 200, 200' and/or 200". Analogous components have similar structure, function and fabrication methods to those described above. For example, the perpendicular magnetic anisotropy energies of the reference layer 230 and of the free layer 210'" each still exceeds the out of plane demagnetization energies of the reference layer 230 and free layer 210'". The magnetic junction 200'" is also configured to allow the free layer 210'" to be switched between stable magnetic states when a write current is passed through the magnetic junction 200'". Thus, the free layer 210'" is switchable utilizing spin transfer torque.

In FIG. 6, the magnetic junction 200'" also includes an additional nonmagnetic spacer layer 240 and an additional reference layer 250. The magnetic junction 200'" is thus a dual magnetic junction. The nonmagnetic spacer layer 240 is analogous to the nonmagnetic spacer layer 220. Thus, the nonmagnetic spacer layer 240 may be an insulating tunneling barrier layer, such as crystalline MgO. However, the thickness and resistance of the layer 240 may be different from that of the layer 220. Similarly, the additional reference layer 250 is analogous to the reference layer 230. Thus, the reference layer 250 may be a multilayer including but not limited to a SAF. The reference layer 250 may also include a PEL. In some embodiments, an electric field is applied during fabrication such that the reference layer 250 has a gradient in oxygen concentration. The reference layer 250 may thus be oxygen poor at its bottom surface, near the nonmagnetic spacer layer 240. In some embodiments, the reference layer 250 may also be oxygen poor at its top surface, near the capping layer(s) 206. The perpendicular magnetic anisotropy energy for the reference layer 250 may exceed the demagnetization energy for the reference layer 250. Thus, the magnetic moment 251 for the reference layer 250 may be out of plane. In the embodiment shown, the magnetic moments 231 and 251 are in opposite directions (dual state). This may be desirable for programming of the free layer 210'" using spin transfer. In other embodiments, the magnetic moments 231 and 251 of the reference layers 230 and 250 may be parallel (antidual state).

Because the magnetic junction 200'" includes two nonmagnetic spacer layers 220 and 240, multiple electric fields may be applied in step 106, during fabrication and/or anneal. One electric field may be or have a component directed toward the spacer layer 220. For example, such an electric field may be applied initially during deposition of the free layer 210'". Thus, anions migrate away from interface between the nonmagnetic spacer layer 220 and the free layer 210'". Another electric field may have a component directed toward the additional nonmagnetic spacer layer 240. For example, such an electric field may be applied later during deposition of the free layer 210'". Thus, anions migrate away from interface between the nonmagnetic spacer layer 240 and the free layer 210'". These electric fields may be applied at the same temperature, but at different times during deposition. Thus, the initial electric field is applied first, followed by the later electric field. In embodiments in which the electric fields are applied during anneal, different anneal temperatures may be used, with higher temperatures preferably being used first and lower temperatures later. The free layer 210'" thus has a gradient in oxygen concentration such that the top and bottom surfaces of the free layer 210'" are oxygen poor.

The magnetic junction 200'" may exhibit improved performance. The free layer 210'" may have improved crystallinity, improved interfaces with the nonmagnetic spacer layers 220 and 240, increased TMR and enhanced PMA. These effects may be further enhanced by the inclusion of an insertion layer within the free layer 210′′′ that has affinity for the anion. Controlling the oxygen gradient in the reference layer 230 and/or 250 may further improve characteristics such as TMR and PMA. The magnetic junction 200′′′ may thus have improved performance.

Figure 7:
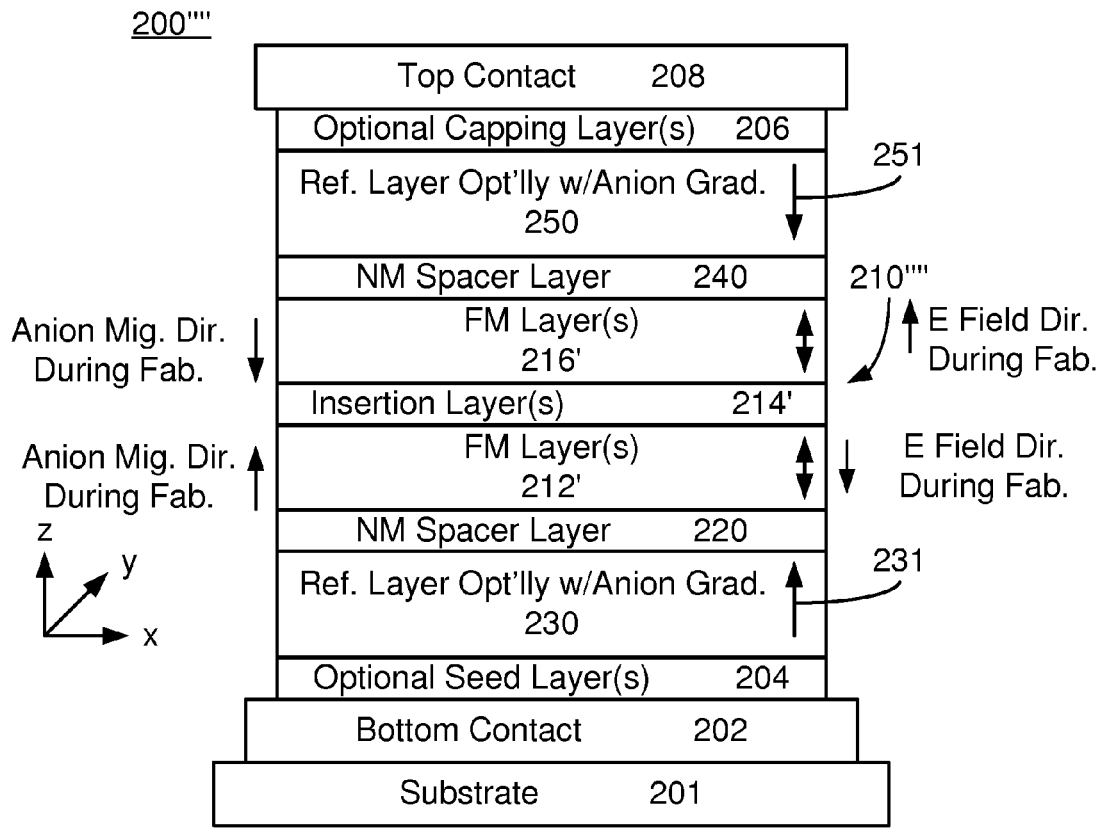
FIG. 7 depicts another exemplary embodiment of a magnetic junction usable in a magnetic memory programmable using spin transfer torque.

FIG. 7 depicts another exemplary embodiment of a magnetic junction 200′′′′ that may be fabricated using the method 100, as well as some surrounding structures. For clarity, FIG. 7 is not to scale. The magnetic junction 200′′′′ may be used in a magnetic device such as a STT-RAM and, therefore, in a variety of electronic devices. The magnetic junction 200′′′′ includes a free layer 210′′′′ having a changeable magnetic moment, a nonmagnetic spacer layer 220, a reference layer 230 having magnetic moment 231, and additional nonmagnetic spacer layer 240 and an additional reference layer 250 that are analogous to the free layer 210/210′/210′′/210′′′, nonmagnetic spacer layer 220, reference layer 230 and magnetic moment 231, additional nonmagnetic spacer layer 240 and additional reference layer 250 having magnetic moment 251, respectively, in previous embodiment(s). Thus, the magnetic junction 200′′′′ is a dual magnetic junction. Also shown are substrate 201, contacts 202 and 208, seed layer(s) 204 and capping layer(s) 206 that are analogous to the substrate 201, contacts 202 and 208, seed layers 204 and capping layers 206, respectively. Analogous components have similar structure, function and fabrication methods to those described above. For example, the perpendicular magnetic anisotropy energies of the reference layers 230 and 250 and of the free layer 210′′′′ each still exceeds the out of plane demagnetization energies of the reference layer 230 and 250 and of the free layer 210′′′′. The magnetic junction 200′′′′ is also configured to allow the free layer 210′′′′ to be switched between stable magnetic states when a write current is passed through the magnetic junction 200′′′′. Thus, the free layer 210′′′′ is switchable utilizing spin transfer torque.

In FIG. 7, the free layer 210′′′′ includes at least two ferromagnetic layers 212′ and 216′ separated by an insertion layer 214′. The layer 212′, 214′ and 216′ are analogous to the layers 212, 214 and 216 depicted in FIG. 5. In some embodiments, the perpendicular magnetic anisotropy energies of the layers 212′ and 216′ each exceeds the out of plane demagnetization energies of the layers 212′ and 216′, respectively. The insertion layer 214′ may have a high oxygen affinity. For example, the insertion layer 214′ may be a layer of one or more of Sc, Y, Ca, Sr, Zr, Hf, Mg, Ti, Ba, Li, K, Na, Rb, Nb, Ag, Be, Ta, I, Al and V.

In the embodiment shown in FIG. 7, multiple electric fields are used in step 106, for fabrication of the free layer 210′′′′. An initial electric field may be applied for the ferromagnetic layer(s) 212′. The initial electric field has at least a component in a direction toward the nonmagnetic spacer layer 220, along the z-axis. Thus, anions in the ferromagnetic layer(s) 212′ migrate away from the nonmagnetic spacer layer 220. An additional electric field is applied for the ferromagnetic layer(s) 216′. The direction of the electric field applied during free layer fabrication causes anions to migrate away from the interface between the nonmagnetic spacer layer 240 and the ferromagnetic layer(s) 216′. This electric field has at least a component in the positive z-direction such that anions migrate in the negative z-direction. The free layer 210′′′′ is, therefore, oxygen poor close to the nonmagnetic spacer layers 220 and 240. As discussed above for the magnetic junction 200, additional electric field(s) may be applied. Thus, the reference layer 230 may be oxygen poor near the bottom and/or top surfaces closer to the nonmagnetic spacer layer(s) 220 and/or 240 as well as away from optional layer(s) 204 and/or 206.

If the electric fields are applied during deposition of the free layer, then the electric field for the layers 212′ is applied first, then the field applied for the layer 216′. In embodiments in which the electric fields are applied during an anneal, the electric field for the layer 212′ may be omitted. Alternatively, different annealing temperatures may be used. Thus, one electric field is applied for a higher anneal temperature while the other electric field is applied for another, lower anneal temperature. Both anneal temperatures may be above the operating temperature as discussed above. In some embodiments in which the electric field(s) are applied during anneal, different deposition techniques for the oxide layer may be used.

The magnetic junction 200′′′′ may exhibit improved performance. As discussed, the free layer 210′′′′ may have be improved crystallinity, improved interfaces with the nonmagnetic spacer layers 220 and 240, increased TMR and enhanced PMA. These effects may be further enhanced by the inclusion of the insertion layer 214′ that has a high oxygen affinity. Controlling the oxygen gradient in the reference layer 230 and/or 250 may further improve characteristics such as TMR and PMA. The magnetic junction 200′′′′ may thus have improved performance.

Figure 8:
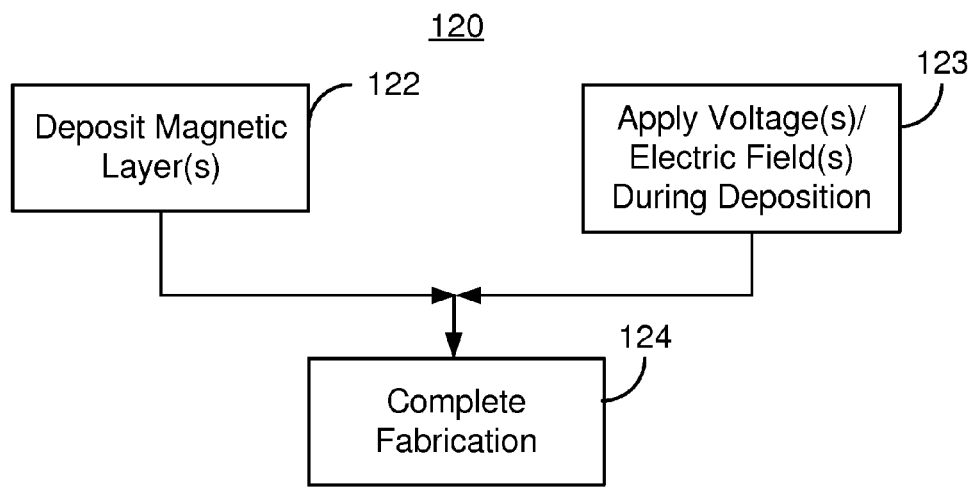
FIG. 8 depicts another exemplary embodiment of a method for providing a magnetic junction usable in a magnetic memory and programmable using spin transfer torque.

FIG. 8 depicts an exemplary embodiment of a method 120 for fabricating a portion of a magnetic junction usable in a magnetic device such as a STT-RAM and, therefore, in a variety of electronic devices. For simplicity, some steps may be omitted, performed in another or combined. Further, the method 120 may start after other steps in forming a magnetic memory have been performed. The method 120 is primarily described in the context of a free layer. However, the method 120 may be extended to fabrication of reference layer(s).

Magnetic layer(s) are deposited, via step 122. The magnetic layer(s) deposited in step 122 may be part of the free layer or of a reference layer. Sputtering and/or other deposition methods may be used in step 122. The methods used in step 122 allow for mobility of the desired anions, such as oxygen. In some embodiments, the deposition methods used cause the local temperature of the magnetic layer(s) being deposited to be higher than the operating temperature of the device being fabricated. The magnetic layer(s) form all of the free or reference layer. Step 122 may deposit the magnetic layer(s) layer on seed layer(s) or a nonmagnetic spacer layer. For example, a CoFeB layer may be deposited in step 122. Other layers that are part of the free or reference layer may also be deposited in step 122.

During deposition in step 122, one or more electric fields in desired directions are applied, via step 123. The electric fields applied in step 123 have a direction selected to cause anion migration away from oxide interfaces. Thus, the migration may be away from the interface between the free layer and the nonmagnetic spacer layer and/or between the free layer and oxide seed layer(s). At least part of step 123 is performed during step 122. However, the electric field may be removed before or after deposition of the free layer is completed in step 122. Thus, steps 122 and 123 may be used in step 106, 102 and/or 110. Fabrication of the magnetic junction may be completed, via step 124.

A magnetic junction, such as the magnetic junction(s) 200, 200′, 200′′, 200′′′ and/or 200′′′′ fabricated using the method 120 may exhibit improved performance. Because the magnetic layer(s) are subjected to an electric field during deposition, anions may migrate in a direction opposite to the electric field direction. This allows the gradient in concentration of the anion to be controlled. For example, the magnetic layer(s) may be oxygen poor closer to a nonmagnetic spacer layer such as crystalline MgO, an oxide seed layer, and/or an oxide capping layer. The free layer and/or reference layer fabricated may have be improved crystallinity, improved interfaces with the nonmagnetic spacer layers, increased TMR and enhanced PMA. These effects may be further enhanced by the inclusion of the insertion layer that has a high oxygen affinity. The magnetic junction fabricated using the method 120 may thus have improved performance.

Figure 9:
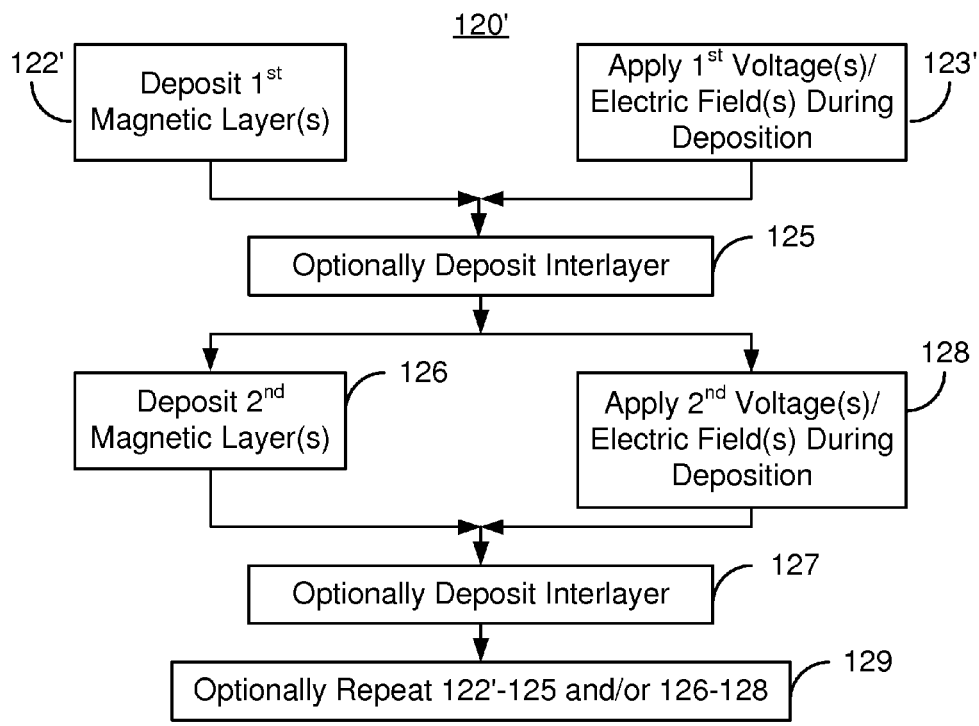
FIG. 9 depicts another exemplary embodiment of a method for providing a magnetic junction usable in a magnetic memory and programmable using spin transfer torque.
Figure 10A:
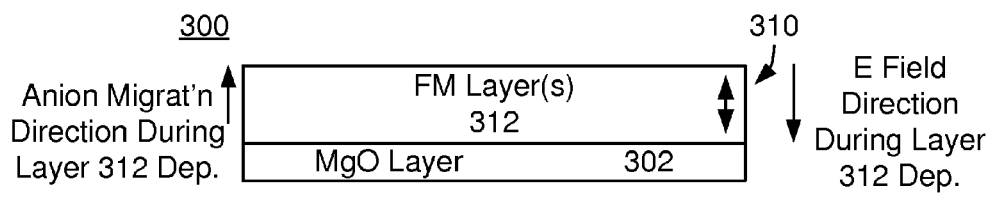
FIGS. 10A-10B depict an exemplary embodiment of a magnetic junction usable in a magnetic memory programmable using spin transfer torque during fabrication.
Figure 10B:
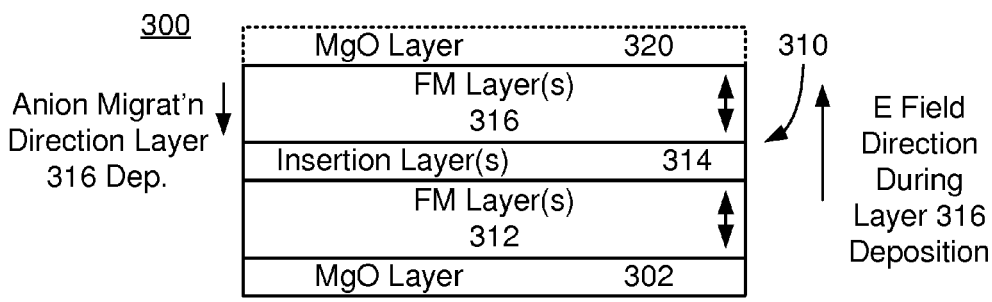

FIG. 9 depicts an exemplary embodiment of a method 120' for fabricating a portion of a magnetic junction usable in a magnetic device such as a STT-RAM and, therefore, in a variety of electronic devices. For simplicity, some steps may be omitted, performed in another or combined. Further, the method 120' may start after other steps in forming a magnetic memory have been performed. The method 120' is analogous to the method 120. Consequently, analogous steps are labeled similarly. FIGS. 10A and 10B depict an exemplary embodiment of a layer of a magnetic junction 300 during fabrication using the method 120'. The method 120' is described in the context of the magnetic junction 300. The method 120' is primarily described in the context of a free layer of the magnetic junction 300. However, the method 120' may be extended to fabrication of reference layer(s).

A first set of magnetic layer(s) are deposited, via step 122'. Step 122' is analogous to at least part of step 122. One or more magnetic layers may be deposited in step 122'. The magnetic layer(s) deposited in step 122' may be part of the free layer or of a reference layer. Sputtering and/or other deposition methods that allow for mobility of the desired anions, such as oxygen may be used in step 122'. In some embodiments, the deposition methods used cause the local temperature of the magnetic layer(s) being deposited to be higher than the operating temperature of the device being fabricated. In other embodiments, the device being fabricated may be heated during deposition in a manner analogous to an anneal. For example, a CoFeB layer may be deposited in step 122'.

During deposition in step 122', one or more electric fields in desired directions are applied, via step 123'. Step 123' is analogous to step 123. The electric fields applied in step 123' have a direction selected to cause anion migration away from an oxide interface. At least part of step 123' is performed during step 122'. However, the electric field may be removed before or after deposition of the magnetic layer(s) is completed in step 122'. Thus, steps 122' and 123' may be used in step 106, 102 and/or 110.

FIG. 10A depicts the magnetic junction 300 during steps 122' and 123'. An MgO layer 302 has already been formed. In some embodiments, the MgO layer 302 is a nonmagnetic spacer layer. In other embodiments, the MgO layer 302 may be a seed layer. Other insulating layers may be used in other embodiments. Ferromagnetic layer(s) 312 are being deposited. These layers 312 are part of a layer 310 of the magnetic junction 300. The layer 310 may be a free layer or a reference layer. For simplicity, the layer 310 is described herein as a free layer 310. In the embodiment shown, the layers 312 adjoin the MgO layer 302. Thus, ferromagnetic layers 312/free layer 310 share an interface with the MgO layer 302.

The electric field applied during step 123' is shown as directed toward the MgO layer 302. In alternate embodiments, the electric field may also have a component in-plane (perpendicular to the direction shown). Because the electric field is directed toward the MgO layer 302, the direction of migration of anions is in a direction away from the MgO layer 302. Stated differently, the anions tend to migrate away from the interface between the MgO layer 302 and the free layer 310. This migration direction is shown in FIG. 10A. Anions migrate in this direction because of the application of the electric field in step 123' and because the deposition of step 122' allows for mobility of the anions. The ferromagnetic layers 312 will, therefore, be oxygen poor near the interface with the MgO layer 302. Thus, the migration may be away from the interface between the free layer and the nonmagnetic spacer layer and/or between the free layer and oxide seed layer(s).

An insertion layer may optionally be deposited, via step 125. The insertion layer may be desired to have a high affinity for oxygen. For example, layer(s) of one or more of Sc, Y, Ca, Sr, Zr, Hf, Mg, Ti, Ba, Li, K, Na, Rb, Ag, Be, Ta, I, Al and V may be deposited in step 125.

A second set of magnetic layer(s) are deposited, via step 126. Step 126 is analogous to at least part of step 122 and to step 122'. One or more magnetic layers may be deposited in step 126. The magnetic layer(s) deposited in step 126 may be part of the free layer or of a reference layer. Sputtering and/or other deposition methods that allow for mobility of the desired anions, such as oxygen may be used in step 126. In some embodiments, the deposition methods used cause the local temperature of the magnetic layer(s) being deposited to be higher than the operating temperature of the device being fabricated. In other embodiments, the device being fabricated may be heated during deposition in a manner analogous to an anneal. For example, a CoFeB layer may be deposited in step 126.

During deposition in step 126, one or more electric fields in desired directions are applied, via step 128. Step 128 is analogous to step 123 and step 123'. The electric fields applied in step 128 have a direction selected to cause anion migration away from an oxide interface. At least part of step 128 is performed during step 126. However, the electric field may be removed before or after deposition of the magnetic layer(s) is completed in step 126. Thus, steps 126 and 128 may be used in step 106, 102 and/or 110.

FIG. 10B depicts the magnetic junction 300 during steps 126 and 128. An insertion layer 314 is shown. In other embodiments, the insertion layer 314 might be omitted. Ferromagnetic layer(s) 316 are being deposited. These layers 316 are part of a free layer 310. Also shown in FIG. 10B is an MgO layer 320 that is to be formed later. In the embodiment shown, the layers 316 will adjoin the MgO layer 320. Thus, ferromagnetic layers 316/free layer 310 share an interface with the MgO layer 320. The MgO layer 320 may be a nonmagnetic spacer layer (e.g. a tunneling barrier layer) or a capping layer. Thus, the magnetic junction 300 being formed may be a dual magnetic tunneling junction, a bottom pinned magnetic tunneling junction, or a top pinned magnetic tunneling junction.

The electric field applied during step 128 is shown as directed toward the MgO layer 320. In alternate embodiments, the electric field may also have a component in-plane (perpendicular to the direction shown). Because the electric field is directed toward the MgO layer 320, the direction of migration of anions is in a direction away from the MgO layer 320. The anions tend to migrate away from the interface between the MgO layer 320 and the free layer 310. This migration direction is shown in FIG. 10B. Anions migrate in this direction because of the application of the electric field in step 128 and because the deposition of step 126 allows for mobility of the anions. The ferromagnetic layers 316 will, therefore, be oxygen poor near the interface with the MgO layer 320. Thus, the migration may be away from the interface between the free layer and the nonmagnetic spacer layer and/or between the free layer and oxide seed layer(s).

A magnetic junction, such as the magnetic junction(s) 300, 200, 200', 200'', 200''' and/or 200'''' fabricated using the method 120' may exhibit improved performance. Because the magnetic layer(s) 312 and 316 are subjected to electric fields in the appropriate directions during deposition, anions may migrate in a direction opposite to the electric field direction. This allows the gradient in concentration of the anion to be controlled. For example, the magnetic layer(s) may be oxygen poor closer to MgO layer(s) 302 and 320 that may function as seed, capping, and/or tunneling barrier layers. The free layer 310 and/or reference layer fabricated may have be improved crystallinity, improved interfaces with the nonmagnetic spacer layers, increased TMR and enhanced PMA. These effects may be further enhanced by the inclusion of the insertion layer 314 that has a high oxygen affinity. The magnetic junction fabricated using the method 120' may thus have improved performance.

Figure 11:
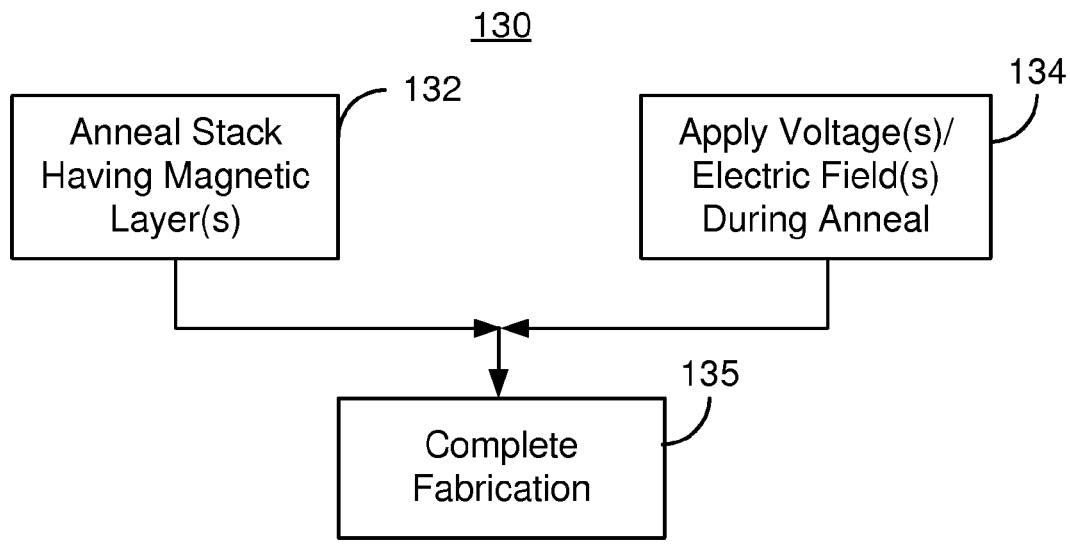
FIG. 11 depicts another exemplary embodiment of a method for providing a magnetic junction usable in a magnetic memory and programmable using spin transfer torque.

FIG. 11 depicts an exemplary embodiment of a method 130 for fabricating a portion of a magnetic junction usable in a magnetic device such as a STT-RAM and, therefore, in a variety of electronic devices. For simplicity, some steps may be omitted, performed in another or combined. Further, the method 130 may start after other steps in forming a magnetic memory have been performed. The method 130 is primarily described in the context of a free layer. However, the method 130 may be extended to fabrication of reference layer(s).

Magnetic layer(s) in a magnetic junction are annealed, via step 132. The anneal of step 132 may be performed after formation of the entire magnetic junction. Thus, the reference, nonmagnetic spacer and free layers have already been deposited and the edges of the magnetic junction defined, for example via an ion mill. In other embodiments, the anneal may be performed in situ, during or between deposition steps for various layers of the magnetic junction. The anneal used in step 132 increases the local temperature of the magnetic junction by increasing the temperature of the environment in which the magnetic junction reside. This allows for mobility of the desired anions, such as oxygen.

During annealing in step 132, one or more electric fields in desired directions are applied, via step 134. The electric fields applied in step 134 have a direction selected to cause anion migration away from oxide interfaces. Thus, the migration may be away from the interface between the free layer and the nonmagnetic spacer layer and/or between the free layer and oxide seed layer(s). At least part of step 134 is performed during step 132. In some embodiments, however, the electric field may be removed after the anneal and cooling of the free layer is completed in step 132. Thus, steps 132 and 134 may be used in step 106, 102 and/or 110. Fabrication of the magnetic junction may be completed, via step 135.

A magnetic junction, such as the magnetic junction(s) 200, 200', 200", 200''' and/or 200"" fabricated using the method 130 may exhibit improved performance. Because the magnetic layer(s) are subjected to an electric field the anneal, anions may migrate in a direction opposite to the electric field direction. Removal of the electric field after cooling allows the anions to remain in these positions. This allows the gradient in concentration of the anion to be controlled. For example, the magnetic layer(s) may be oxygen poor closer to a nonmagnetic spacer layer such as crystalline MgO, an oxide seed layer, and/or an oxide capping layer. The free layer and/or reference layer fabricated may have be improved crystallinity, improved interfaces with the nonmagnetic spacer layers, increased TMR and enhanced PMA. These effects may be further enhanced by the inclusion of the insertion layer that has a high oxygen affinity. The magnetic junction fabricated using the method 130 may thus have improved performance.

Figure 12:
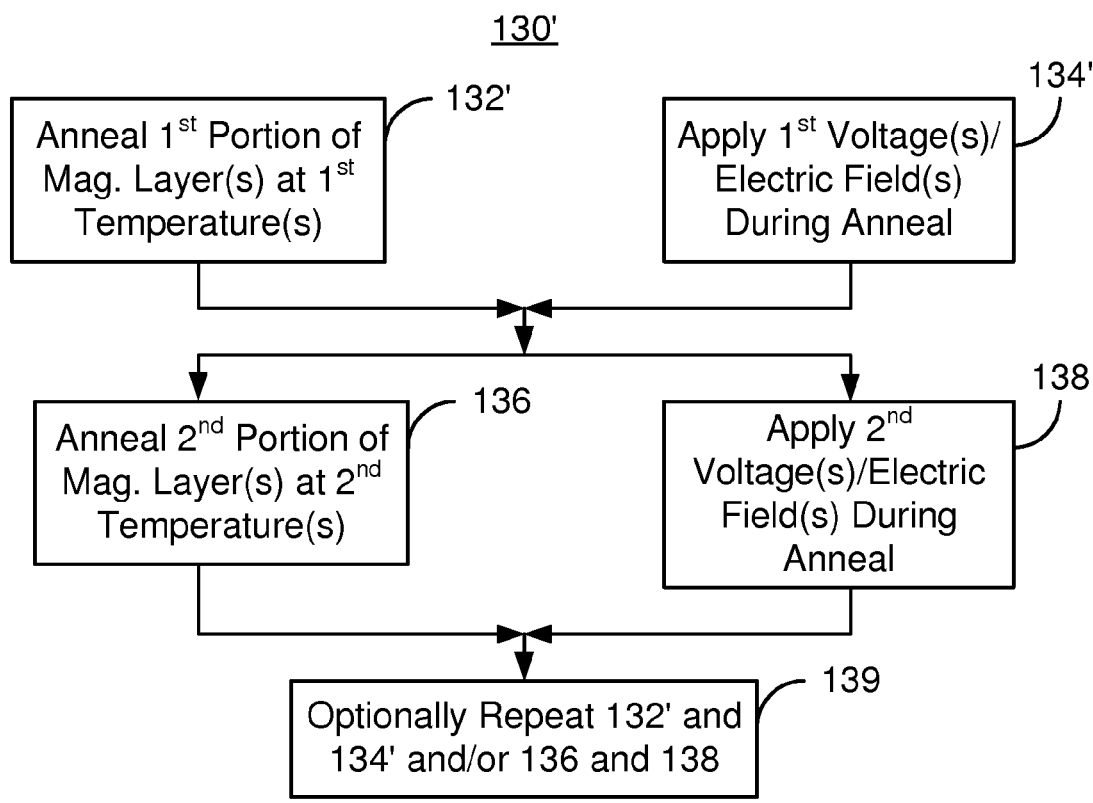
FIG. 12 depicts another exemplary embodiment of a method for providing a magnetic junction usable in a magnetic memory and programmable using spin transfer torque.
Figure 13A:
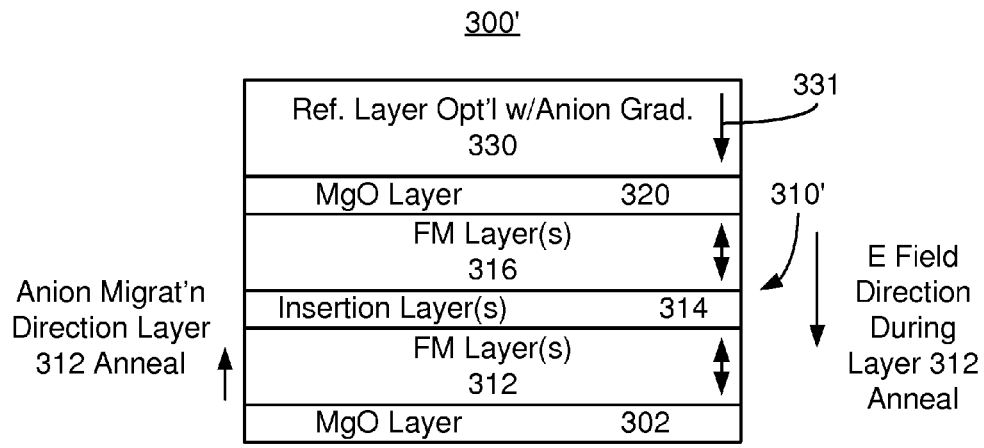
FIGS. 13A-13B depict an exemplary embodiment of a magnetic junction usable in a magnetic memory programmable using spin transfer torque during fabrication.
Figure 13B:
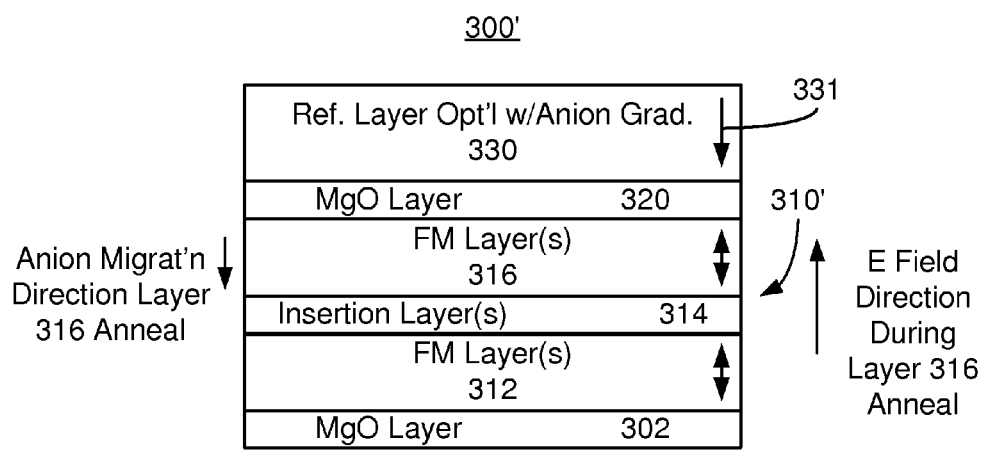

FIG. 12 depicts an exemplary embodiment of a method 130' for fabricating a portion of a magnetic junction usable in a magnetic device such as a STT-RAM and, therefore, in a variety of electronic devices. For simplicity, some steps may be omitted, performed in another or combined. Further, the method 130' may start after other steps in forming a magnetic memory have been performed. The method 130' is analogous to the method 130. Consequently, analogous steps are labeled similarly. FIGS. 13A and 13B depict an exemplary embodiment of a layer of a magnetic junction 300' during fabrication using the method 130'. The method 130' is described in the context of the magnetic junction 300'. The method 130' is primarily described in the context of a free layer of the magnetic junction 300'. However, the method 130' may be extended to fabrication of reference layer(s).

A first anneal is performed, via step 132'. Step 132' is analogous to at least part of step 132. Some or all of the magnetic junction is brought to a temperature in excess of the operating temperature in step 132'.

During the anneal in step 132', one or more electric fields in desired directions are applied, via step 134'. Step 134' is analogous to step 134. The electric fields applied in step 134' have a direction selected to cause anion migration away from an oxide interface. At least part of step 134' is performed during step 132'. The electric field may be removed after the anneal and cooling of the magnetic layer(s) is completed in step 132'. Thus, steps 132' and 134' may be used in step 106, 102 and/or 110.

FIG. 13A depicts the magnetic junction 300' during steps 132' and 134'. The magnetic junction 300' includes an MgO layer 302, a free layer 310', an additional MgO layer 320 and a reference layer 330. The layer 310' is described as a free layer. In other embodiments, the layer 310' may be a reference layer. In some embodiments, the MgO layer 302 is a nonmagnetic spacer layer. In such embodiments an additional reference layer (not shown) resides below the MgO layer 302. In other embodiments, the MgO layer 302 may be a seed layer. Other insulating layers may be used in other embodiments. The free layer 310' includes ferromagnetic layer(s) 312 and 316 separated by insertion layer 314. The insertion layer 314 may have a high oxygen affinity, such as one or more of Sc, Y, Ca, Sr, Zr, Hf, Mg, Ti, Ba, Li, K, Na, Rb, Nb, Ag, Be, Ta, I, Al and V. For simplicity, the layer 310 is described herein as a free layer 310. In the embodiment shown, the layers 312 adjoin and share an interface with the MgO layer 302. The ferromagnetic layers 316 share an interface with the MgO layers 320. Thus, ferromagnetic layers 312 and 316/free layer 310' share interfaces with the MgO layer 302.

The electric field applied during step 134' is shown as directed toward the MgO layer 302. In alternate embodiments, the electric field may also have a component in-plane (perpendicular to the direction shown). Because the electric field is directed toward the MgO layer 302, the direction of migration of anions is in a direction away from the MgO layer 302. The anions tend to migrate away from the interface between the MgO layer 302 and the free layer 310'. This migration direction is shown in FIG. 13A. Anions migrate in this direction because of the application of the electric field in step 134' and because the deposition of step 132' allows for mobility of the anions. The ferromagnetic layers 312 will, therefore, be oxygen poor near the interface with the MgO layer 302. Thus, the migration may be away from the interface between the free layer and the nonmagnetic spacer layer and/or between the free layer and oxide seed layer(s).

A second anneal is performed, via step 136. Step 136 is analogous to at least part of step 132'. However, the anneal in step 136 may be at a different, lower temperature than the anneal performed in step 132'. During the anneal in step 136, one or more electric fields in desired directions are applied, via step 138. Step 138 is analogous to step 134'. The electric fields applied in step 138 have a direction selected to cause anion migration away from an oxide interface. At least part of step 138 is performed during step 136. However, the electric field may be removed after the anneal is completed and the magnetic junction 300' cools.

FIG. 13B depicts the magnetic junction 300' during steps 136 and 138. In the embodiment shown, the ferromagnetic layers 316/free layer 310' share an interface with the MgO layer 320. The electric field applied during step 128 is shown as directed toward the MgO layer 320. In alternate embodiments, the electric field may also have a component in-plane (perpendicular to the direction shown). Because the electric field is directed toward the MgO layer 320, the direction of migration of anions is in a direction away from the MgO layer 320. The anions tend to migrate away from the interface between the MgO layer 320 and the free layer 310'. This migration direction is shown in FIG. 13B. Anions migrate in this direction because of the application of the electric field in step 138 and because the anneal of step 136 allows for mobility of the anions. The ferromagnetic layers 316 will, therefore, be oxygen poor near the interface with the MgO layer 320. Thus, the migration may be away from the interface between the free layer and the nonmagnetic spacer layer and/or between the free layer and oxide seed layer(s).

A magnetic junction, such as the magnetic junction(s) 300, 200, 200', 200", 200"' and/or 200"" fabricated using the method 130' may exhibit improved performance. Because the magnetic layer(s) 312 and 316 are subjected to electric fields in the appropriate directions during deposition, anions may migrate in a direction opposite to the electric field direction. This allows the gradient in concentration of the anion to be controlled. For example, the magnetic layer(s) may be oxygen poor closer to MgO layer(s) 302 and 320 that may function as seed, capping, and/or tunneling barrier layers. The free layer 310' and/or reference layer fabricated may have be improved crystallinity, improved interfaces with the nonmagnetic spacer layers, increased TMR and enhanced PMA. These effects may be further enhanced by the inclusion of the insertion layer 314 that has a high oxygen affinity. The magnetic junction fabricated using the method 130' may thus have improved performance.

Figure 14:
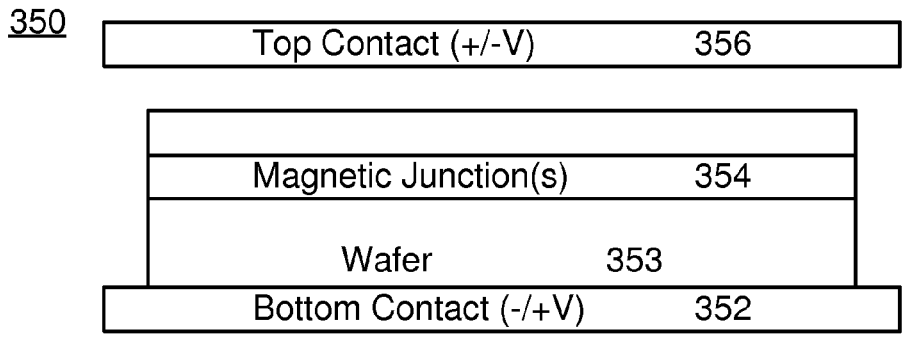
FIG. 14 depicts an exemplary embodiment of a substrate including magnetic junction(s) usable in a magnetic memory programmable using spin transfer torque during fabrication.
Figure 15:
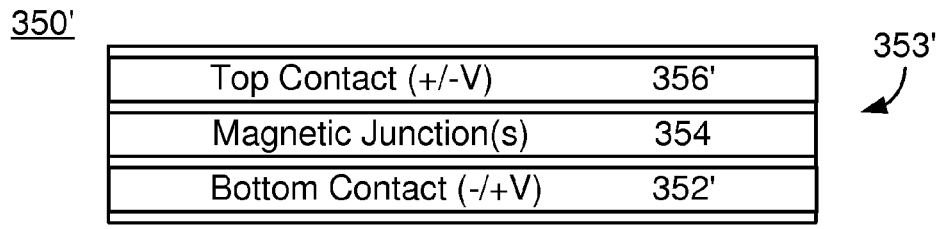
FIG. 15 depicts an exemplary embodiment of a substrate including magnetic junction(s) usable in a magnetic memory programmable using spin transfer torque during fabrication.

FIGS. 14 and 15 depict embodiments of systems 350 and 350', respectively, that may be used to provide the electric fields described above. FIG. 14 depicts a system in which the contacts 352 and 356 are separate from the wafer 353 on which the magnetic junctions 354 are being fabricated. The contacts 352 and 356 may be part of a deposition chamber or annealing furnace used in fabricating the magnetic junctions. The electric field is applied by developing a voltage between the contacts 352 and 356. As a result, an electric field is provided across the gap between the contacts 352 and 356. The wafer 353 resides in this gap. Thus, the electric field is applied to the magnetic junctions (or portions thereof) being fabricated on the wafer 353. FIG. 15 depicts a system 350' in which the contacts 352' and 356' are integrated within the wafer 353'. The magnetic junctions 354 are fabricated between the contacts 352' and 354'. The electric field is applied by developing a voltage between the contacts 352' and 356'. As a result, an electric field is provided across the gap between the contacts 352' and 356. The magnetic junctions 354 reside in this gap. Thus, the electric field is applied to the magnetic junctions (or portions thereof) being fabricated on the wafer 353'. Thus, an electric field may be applied to magnetic junctions during fabrication.

Figure 16:
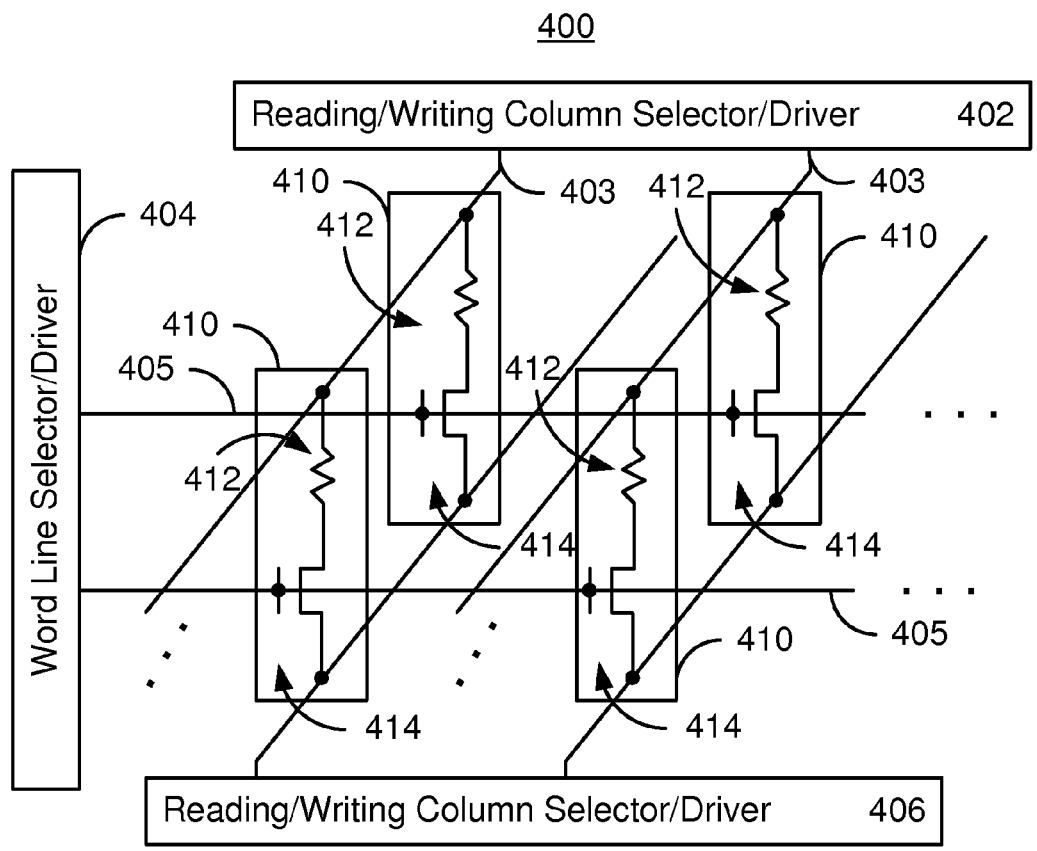
FIG. 16 depicts an exemplary embodiment of a memory utilizing magnetic junctions in the memory element(s) of the storage cell(s).

FIG. 16 depicts an exemplary embodiment of a memory 400 that may use one or more of the magnetic junctions 200, 200', 200", 200"', 200"", 300, and/or 354. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 200, 200', 200", 200"', 200"", 300 and/or 354 disclosed herein. Although one magnetic junction 412 is shown per cell 410, in other embodiments, another number of magnetic junctions 412 may be provided per cell. As such, the magnetic memory 400 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a magnetic junction on a substrate usable in a magnetic device, the method comprising:
   providing a reference layer;
   providing a nonmagnetic spacer layer;
   providing a free layer, the nonmagnetic spacer layer being between the free layer and the reference layer, an interface being between the nonmagnetic spacer layer and the free layer, the step of providing the free layer further including applying at least one electric field while the free layer is at a local temperature above an operating temperature of the magnetic junction, the at least one electric field exerting a force on an anion in the free layer in a direction away from the interface between the free layer and the nonmagnetic spacer layer;
   wherein the magnetic junction is configured such that the free layer is switchable between a plurality of stable magnetic states when a write current is passed through the magnetic junction.

2. The method of claim 1 wherein the step of applying the at least one electric field further includes:
   applying a voltage across the free layer, the at least one electric field being a derivative of the voltage with respect to a direction through the free layer.

3. The method of claim 1 wherein at least one of the free layer and the reference layer has a perpendicular magnetic anisotropy energy greater than an out-of-plane demagnetization energy.

4. The method of claim 1 wherein the step of applying the at least one electric field further includes:
   applying the at least one electric field during deposition of the free layer.

5. The method of claim 1 wherein the step of applying the at least one electric field further includes:
   annealing the free layer during application of the at least one electric field.

6. The method of claim 5 wherein the step of annealing the free layer further includes:
   annealing the free layer at a temperature of at least three hundred degrees centigrade.

7. The method of claim 1 further comprising:
providing an additional nonmagnetic spacer layer, the free layer residing between the additional nonmagnetic spacer layer and the nonmagnetic spacer layer; and
providing an additional reference layer, the additional nonmagnetic spacer layer being between the free layer and the additional reference layer.

8. The method of claim 7 wherein the step of providing the free layer further includes
applying at least an additional electric field while the free layer is at an additional local temperature above the operating temperature of the magnetic junction, the at least the additional electric field exerting an additional force on an anion in the free layer in a direction away from an additional interface between the free layer and the additional nonmagnetic spacer layer.

9. The method of claim 1 wherein the step of applying the at least the additional electric field further includes:
applying an additional voltage across the free layer, the at least the additional electric field being an additional derivative of the additional voltage with respect to an additional direction through the free layer.

10. The method of claim 1 wherein the step of applying the at least the additional electric field further includes:
applying the at least the additional electric field during deposition of the free layer.

11. The method of claim 1 wherein the anion is ionized oxygen.

12. The method of claim 1 wherein the step of providing the reference layer further includes:
applying at least one additional electric field while the reference layer is at an additional local temperature above the operating temperature of the magnetic junction, the at least one additional electric field exerting an additional force on the anion in the reference layer in an additional direction away from an additional interface between the reference layer and the nonmagnetic spacer layer.

13. A magnetic junction residing on a substrate and usable in a magnetic device comprising:
a reference layer;
a nonmagnetic spacer layer; and
a free layer, the nonmagnetic spacer layer residing between the reference layer and the free layer, an interface being between the nonmagnetic spacer layer and the free layer, the free layer having a gradient in concentration of an anion such that the concentration of the anion decreases from at least a center of the free layer toward the interface;
wherein the magnetic junction is configured such that the free layer is switchable between a plurality of stable magnetic states when a write current is passed through the magnetic junction.

14. The magnetic junction of claim 13 wherein the anion is ionized oxygen.

15. The magnetic junction of claim 13 wherein at least one of the free layer and the reference layer has a perpendicular magnetic anisotropy energy greater than an out-of-plane demagnetization energy.

16. The magnetic junction of claim 13 further comprising:
an additional nonmagnetic spacer layer, the free layer residing between the additional nonmagnetic spacer layer and the nonmagnetic spacer layer, an additional interface being between the additional nonmagnetic spacer layer and the free layer; and
an additional pinned layer, the additional nonmagnetic spacer layer being between the free layer and the additional pinned layer.

17. The magnetic junction of claim 16 wherein the free layer the gradient in concentration of the anion is such that the concentration of the anion decreases from at least the center of the free layer toward the additional interface.

18. The magnetic junction of claim 13 wherein the reference layer further has an additional gradient in concentration of the anion such that a reference layer concentration of the anion decreases from at least a reference layer center toward an additional interface between the reference layer and the nonmagnetic spacer layer.

19. A magnetic memory residing on a substrate, the magnetic memory comprising:
a plurality of magnetic storage cells, each of the plurality of magnetic storage cells including at least one magnetic junction, the at least one magnetic junction including a reference layer, a nonmagnetic spacer layer and a free layer, the nonmagnetic spacer layer residing between the reference layer and the free layer, an interface being between the nonmagnetic spacer layer and the free layer, the free layer having a gradient in concentration of an anion such that the concentration of the anion decreases from at least a center of the free layer toward the interface, the magnetic junction being configured such that the free layer is switchable between a plurality of stable magnetic states when a write current is passed through the magnetic junction; and
a plurality of bit lines coupled with the plurality of magnetic storage cells.

20. The magnetic memory of claim 19 wherein the anion is ionized oxygen.

21. The magnetic memory of claim 19 wherein the magnetic junction further includes:
an additional nonmagnetic spacer layer, the free layer residing between the additional nonmagnetic spacer layer and the nonmagnetic spacer layer, an additional interface being between the additional nonmagnetic spacer layer and the free layer; and
an additional pinned layer, the additional nonmagnetic spacer layer being between the free layer and the additional pinned layer.

22. The magnetic memory of claim 21 wherein the free layer the gradient in concentration of the anion is such that the concentration of the anion decreases from at least the center of the free layer toward the additional interface.

23. The magnetic memory of claim 19 wherein the reference layer further has an additional gradient in concentration of the anion such that a reference layer concentration of the anion decreases from at least a reference layer center toward an additional interface between the reference layer and the nonmagnetic spacer layer.

* * * * *